US012660288B2

(12) United States Patent
Hu et al.

(10) Patent No.: US 12,660,288 B2
(45) Date of Patent: Jun. 16, 2026

(54) THIN FILM TRANSISTOR, MANUFACTURING METHOD FOR THE SAME, AND DISPLAY SUBSTRATE

(71) Applicant: BOE Technology Group Co., Ltd., Beijing (CN)

(72) Inventors: Hehe Hu, Beijing (CN); Dongfang Wang, Beijing (CN); Fengjuan Liu, Beijing (CN); Ce Ning, Beijing (CN); Zhengliang Li, Beijing (CN); Jiayu He, Beijing (CN); Yan Qu, Beijing (CN); Kun Zhao, Beijing (CN); Jie Huang, Beijing (CN); Liping Lei, Beijing (CN); Yunsik Im, Beijing (CN); Shunhang Zhang, Beijing (CN); Nianqi Yao, Beijing (CN); Feifei Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 624 days.

(21) Appl. No.: 17/925,222

(22) PCT Filed: Dec. 27, 2021

(86) PCT No.: PCT/CN2021/141591
§ 371 (c)(1),
(2) Date: Nov. 14, 2022

(87) PCT Pub. No.: WO2023/122876
PCT Pub. Date: Jul. 6, 2023

(65) Prior Publication Data
US 2024/0234532 A1 Jul. 11, 2024

(51) Int. Cl.
H10D 86/40 (2025.01)
H10D 30/01 (2025.01)
(Continued)

(52) U.S. Cl.
CPC ......... H10D 64/605 (2025.01); H10D 30/031 (2025.01); H10D 30/6729 (2025.01); H10D 86/40 (2025.01); H10D 86/60 (2025.01)

(58) Field of Classification Search
CPC ........ H10D 30/67–6759; H10D 30/031–0327; H10D 86/021–0251; H10D 30/6755;
(Continued)

(56) References Cited

U.S. PATENT DOCUMENTS

| | | | |
|---|---|---|---|
| 6,127,703 | A | 10/2000 | Letavic et al. |
| 2006/0214229 | A1 | 9/2006 | Toyoda et al. |

(Continued)

FOREIGN PATENT DOCUMENTS

| | | |
|---|---|---|
| CN | 1321340 A | 11/2001 |
| CN | 1838433 A | 9/2006 |

(Continued)

*Primary Examiner* — Moin M Rahman
(74) *Attorney, Agent, or Firm* — IPro, PLLC

(57) ABSTRACT

The present disclosure provides a TFT, a manufacturing method and a display substrate, and it relates to the field of TFT technology. The TFT includes: a base substrate; a gate electrode arranged on the base substrate; an active layer arranged at a side of the gate electrode away from the base substrate, an orthogonal projection of the active layer onto the base substrate overlapping with an orthogonal projection of the gate electrode onto the base substrate; and a source electrode and a drain electrode arranged at a side of the active layer away from the base substrate and coupled to the active layer. A resistance between the gate electrode and the drain electrode is greater than a resistance between the gate electrode and the source electrode. According to the present disclosure, it is able to increase a withstand voltage range of the TFT.

16 Claims, 6 Drawing Sheets

(51) Int. Cl.
H10D 30/67 (2025.01)
H10D 64/60 (2025.01)
H10D 86/60 (2025.01)

(58) Field of Classification Search
CPC .. H10D 86/423; H10D 86/60; H10D 86/0221; H10D 86/40; H10D 86/425; H10D 86/427; H10D 86/431; H10D 86/471; H10D 30/6728; H10D 30/6729; H10D 30/6731; H10D 30/6745; H10D 86/481; H10D 86/441; H10D 64/62; H10D 30/6723; H10D 62/80; H10D 86/0231; H10D 99/00; H10D 30/6713; H10K 10/46–491; H10K 59/1213; H10K 59/1201; H10K 59/124; H10K 59/122; H10K 50/844; H10K 59/873; H10K 77/111; H10K 59/131; H10K 59/129; H10K 2102/311; H10K 2102/361; C23C 14/35; G02F 1/1343; G02F 1/13363; G02F 1/133305; G02F 1/133388; G02F 1/13452; G02F 1/136254; G02F 2201/50; G02F 2202/28; G03F 5/16; H01L 21/02565; H01L 21/02631; H01L 21/0274; H01L 21/443; H01L 21/77; H01L 2224/73204; Y02E 10/549; G09G 2300/0426
See application file for complete search history.

(56) References Cited

U.S. PATENT DOCUMENTS

| | | | |
|---|---|---|---|
| 2012/0298985 A1* | 11/2012 | Chung | H10D 30/6756 |
| | | | 257/E21.409 |
| 2013/0137255 A1* | 5/2013 | Yamade | H01L 21/265 |
| | | | 438/530 |
| 2020/0273400 A1* | 8/2020 | Lou | H10K 59/122 |
| 2021/0359140 A1* | 11/2021 | Hu | H10D 30/0321 |

FOREIGN PATENT DOCUMENTS

| | | |
|---|---|---|
| JP | 2006093684 A | 4/2006 |
| WO | 9619833 A1 | 6/1996 |

* cited by examiner

02 a3

01

04

03

03

01

04

02

THIN FILM TRANSISTOR, MANUFACTURING METHOD FOR THE SAME, AND DISPLAY SUBSTRATE

CROSS-REFERENCE TO RELATED APPLICATION

This application is the U.S. national phase of PCT Application No. PCT/CN2021/141591 filed on Dec. 27, 2021, the disclosure of which is incorporated in its entirety by reference herein.

TECHNICAL FIELD

The present disclosure relates to the field of Thin Film Transistor (TFT) technology, in particular to a TFT, a manufacturing method thereof and a display device.

BACKGROUND

Currently, a TFT array has been widely used in display products. Along with an increase in a driving current for a TFT of the display product, a desired driving voltage increases gradually, resulting in a breakdown or failure of the TFT. Hence, it is very important to increase a withstand voltage of the TFT.

SUMMARY

An object of the present disclosure is to provide a TFT, a manufacturing method thereof and a display substrate, so as to increase a withstand voltage range of the TFT.

In order to solve the above-mentioned technical problem, the present disclosure provides the following technical solutions.

In one aspect, the present disclosure provides in some embodiments a TFT, including: a base substrate; a gate electrode arranged on the base substrate; an active layer arranged at a side of the gate electrode away from the base substrate, an orthogonal projection of the active layer onto the base substrate overlapping with an orthogonal projection of the gate electrode onto the base substrate; and a source electrode and a drain electrode arranged at a side of the active layer away from the base substrate and coupled to the active layer. A resistance between the gate electrode and the drain electrode is greater than a resistance between the gate electrode and the source electrode.

In a possible embodiment of the present disclosure, the orthogonal projection of the gate electrode onto the base substrate does not overlap with an orthogonal projection of the drain electrode onto the base substrate, and the orthogonal projection of the gate electrode onto the base substrate overlaps with an orthogonal projection of the source electrode onto the base substrate.

In a possible embodiment of the present disclosure, the active layer includes a first portion in contact with the drain electrode and a second portion in contact with the source electrode, an orthogonal projection of the first portion onto the base substrate does not overlap with the orthogonal projection of the gate electrode onto the base substrate, and an orthogonal projection of the second portion onto the base substrate overlaps with the orthogonal projection of the gate electrode onto the base substrate. The TFT further includes an additional gate electrode, and an orthogonal projection of the additional gate electrode onto the base substrate overlaps with the orthogonal projection of the first portion onto the base substrate.

In a possible embodiment of the present disclosure, the orthogonal projection of the active layer onto the base substrate falls within the orthogonal projection of the gate electrode onto the base substrate, and the active layer includes a first portion in contact with the drain electrode and a second portion in contact with the source electrode. The TFT further includes an additional gate electrode arranged at a side of the active layer away from the base substrate, and an orthogonal projection of the additional gate electrode onto the base substrate overlaps with an orthogonal projection of the first portion onto the base substrate.

In a possible embodiment of the present disclosure, the orthogonal projection of the additional gate electrode onto the base substrate falls within the orthogonal projection of the gate electrode onto the base substrate.

In a possible embodiment of the present disclosure, a minimum distance between a first boundary of the additional gate electrode close to the source electrode and a second boundary of the drain electrode close to the source electrode is a1 in a direction parallel to the base substrate, a1 is greater than 0 and smaller than L, and L is a length of a channel of the TFT.

In a possible embodiment of the present disclosure, the active layer includes a first portion in contact with the drain electrode and a second portion in contact with the source electrode, and resistivity of the first portion is greater than resistivity of the second portion.

In a possible embodiment of the present disclosure, the resistivity $R_S$ of the first portion meets 100 M$\Omega$/$\square\geq$Rs$\geq$1 M$\Omega$/$\square$.

In a possible embodiment of the present disclosure, a minimum distance between a third boundary of the first portion close to the source electrode and a second boundary of the drain electrode close to the source electrode is a2 in a direction parallel to the base substrate, where a2 is greater than 0 $\mu$m and smaller than or equal to 2 $\mu$m.

In a possible embodiment of the present disclosure, the TFT further includes a conductive pattern arranged between the active layer and the drain electrode, resistivity of the conductive pattern is greater than resistivity of the drain electrode, and the active layer is electrically coupled to the drain electrode through the conductive pattern.

In a possible embodiment of the present disclosure, the resistivity R of the conductive pattern meets 100 M$\Omega$/$\square\geq$R$\geq$1 M$\Omega$/$\square$.

In a possible embodiment of the present disclosure, the orthogonal projection of the gate electrode onto the base substrate does not overlap with an orthogonal projection of the source electrode onto the base substrate, and the orthogonal projection of the gate electrode onto the base substrate does not overlap with an orthogonal projection of the drain electrode onto the base substrate. A distance between a fourth boundary of a first orthogonal projection of the gate electrode onto the base substrate close to the source electrode and a fifth boundary of a second orthogonal projection of the source electrode onto the base substrate close to the gate electrode is a3, and a distance between a sixth boundary of the first orthogonal projection of the gate electrode onto the base substrate close to the drain electrode and a seventh boundary of a third orthogonal projection of the drain electrode onto the base substrate close to the gate electrode is a3, where a3 is greater than 0.

In a possible embodiment of the present disclosure, a3 is smaller than 2 $\mu$m.

In a possible embodiment of the present disclosure, the TFT further includes a buffer layer arranged between the gate electrode and the base substrate, the active layer includes a third portion and a fourth portion, an orthogonal projection of the third portion onto the base substrate is located between, and does not overlap with, the first orthogonal projection and the second orthogonal projection, an orthogonal projection of the fourth portion onto the base substrate is located between, and does not overlap with, the first orthogonal projection and the third orthogonal projection, and the third portion and the fourth portion are each a lightly-doped region.

In another aspect, the present disclosure provides in some embodiments a display substrate including the above-mentioned TFT.

In a possible embodiment of the present disclosure, a voltage applied to the additional gate electrode is 5V to 10V during the display.

In a possible embodiment of the present disclosure, a voltage applied to the gate electrode is V1 and a voltage applied to the additional gate electrode is V$\frac{1}{2}$-V1 during the display.

In yet another aspect, the present disclosure provides in some embodiments a method for manufacturing a TFT, including: providing a base substrate; forming a gate electrode on the base substrate; forming an active layer at a side of the gate electrode away from the base substrate, an orthogonal projection of the active layer onto the base substrate overlapping with an orthogonal projection of the gate electrode onto the base substrate; and forming a source electrode and a drain electrode at a side of the active layer away from the base substrate, the source electrode and the drain electrode being coupled to the active layer. A resistance between the gate electrode and the drain electrode is greater than a resistance between the gate electrode and the source electrode.

REFERENCE SIGN LIST

Figure 1:
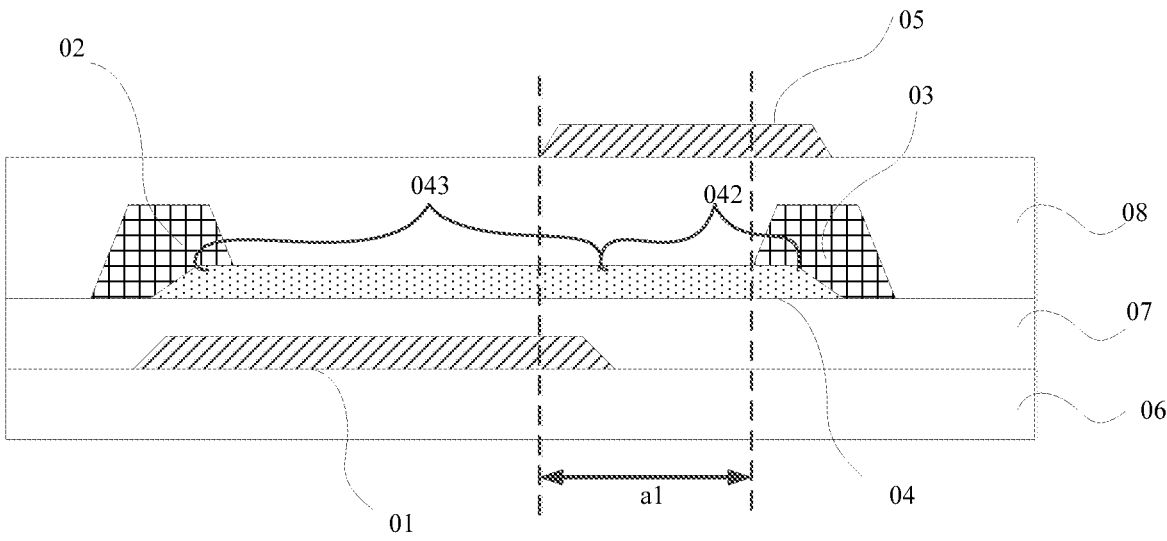
FIGS. 1 to 10 are respective schematic views showing a TFT according to one embodiment of the present disclosure.

01 gate electrode
02 source electrode
03 drain electrode
04 active layer
05 additional electrode
06 base substrate
07 gate insulation layer
08 interlayer insulation layer
041, 042 first portion
043 second portion
044 third portion
045 fourth portion
09 conductive pattern
10 buffer layer

DETAILED DESCRIPTION

In order to make the objects, the technical solutions and the advantages of the present disclosure more apparent, the present disclosure will be described hereinafter in a clear and complete manner in conjunction with the drawings and embodiments.

An object of the present disclosure is to provide a TFT, a manufacturing method thereof and a display substrate, so as to increase a withstand voltage range of the TFT.

The present disclosure provides in some embodiments a TFT, which includes: a base substrate; a gate electrode arranged on the base substrate; an active layer arranged at a side of the gate electrode away from the base substrate, an orthogonal projection of the active layer onto the base substrate overlapping with an orthogonal projection of the gate electrode onto the base substrate; and a source electrode and a drain electrode arranged at a side of the active layer away from the base substrate and coupled to the active layer. A resistance between the gate electrode and the drain electrode is greater than a resistance between the gate electrode and the source electrode.

In the embodiments of the present disclosure, the resistance between the gate electrode and the drain electrode of the TFT is greater than the resistance between the gate electrode and the source electrode, and a withstand voltage range of the TFT is in direct proportion to the resistance between the gate electrode and the drain electrode. Through providing a large resistance between the gate electrode and the drain electrode, it is able to reduce a current density at a position in proximity to the drain electrode, thereby to increase the withstand voltage range of the TFT.

In some embodiments of the present disclosure, the orthogonal projection of the gate electrode onto the base substrate does not overlap with an orthogonal projection of the drain electrode onto the base substrate, and the orthogonal projection of the gate electrode onto the base substrate overlaps with an orthogonal projection of the source electrode onto the base substrate. A portion of the active layer between the gate electrode and the drain electrode is spaced apart from the gate electrode at a large distance. At this position, a gate electrode electric field is weak, and it is difficult for the gate electrode to efficiently control the portion of the active layer. As a result, it is able to improve a distance of a channel between the gate electrode and the drain electrode, and reduce the current density in proximity to the drain electrode, thereby to increase the withstand voltage range of the TFT.

For example, as shown in FIG. 1, the TFT includes a gate electrode 01, a gate insulation layer 07, an active layer 04, a source electrode 02, a drain electrode 03, and an interlayer insulation layer 08 arranged on a base substrate 06. The active layer 04 includes a first portion 042 in contact with the drain electrode 03 and a second portion 043 in contact with the source electrode 02. An orthogonal projection of the first portion 042 onto the base substrate does not overlap with an orthogonal projection of the gate electrode 01 onto the base substrate, and an orthogonal projection of the second portion 043 onto the base substrate completely or partially overlaps with the orthogonal projection of the gate electrode 01 onto the base substrate. At this time, the gate electrode 01 is spaced apart from the first portion 042 at a large distance, and it is difficult for the gate electrode 01 to efficiently control the first portion 042. As a result, it is able to increase a resistance of the first portion 042 during the operation of the TFT, and reduce a current density in proximity to the drain electrode 03, thereby to increase the withstand voltage range of the TFT.

An on-state current of the TFT is reduced when it is difficult for the gate electrode 02 to efficiently control the first portion 042. In order to ensure the on-state current of the TFT, as shown in FIG. 1, the TFT further includes an additional gate electrode 05. An orthogonal projection of the additional gate electrode 05 onto the base substrate overlaps with the orthogonal projection of the first portion 042 onto the base substrate, i.e., the orthogonal projection of the additional gate electrode onto the base substrate partially overlaps with the orthogonal projection of the first portion 042 onto the base substrate, or the orthogonal projection of the additional gate electrode onto the base substrate falls within the orthogonal projection of the first portion 042 onto the base substrate, or the orthogonal projection of the first portion 042 onto the base substrate falls within the orthogonal projection of the additional gate electrode onto the base substrate.

In this way, the first portion 042 is controlled through applying an electric signal onto the additional gate electrode 05, so as to adjust the on-state current of the TFT. To be specific, when a positive electric signal is applied to the additional gate electrode 05, a resistance of the first portion 042 is reduced, so it is able to increase the on-state current of the TFT. When a negative electric signal is applied to the additional gate electrode 05, the resistance of the first portion 042 is increased, so it is able to reduce the on-state current of the TFT. Specifically, during the operation of the TFT, a voltage applied to the additional gate electrode 05 is 5V to 10V, so as to ensure the on-state current of the TFT.

The additional gate electrode 05 and the gate electrode 01 are arranged at a same side of the active layer 04 or at different sides of the active layer 04, and they are insulated from each other.

As shown in FIG. 1, a minimum distance between a first boundary of the additional gate electrode 05 close to the source electrode 02 and a second boundary of the drain electrode 03 close to the source electrode 02 is a1 in a direction parallel to the base substrate, a1 is greater than 0 and smaller than L, and L is a length of a channel of the TFT. The channel is a portion of the active layer corresponding to a gap between the source electrode and the drain electrode, and an orthogonal projection of the channel onto the base substrate overlaps with an orthogonal projection of the gap between the source electrode and the drain electrode onto the base substrate. When a1 is greater than 0 and smaller than L, the additional gate electrode mainly controls a region of the channel close to the drain electrode, rather than an entire region of the channel.

Figure 2:
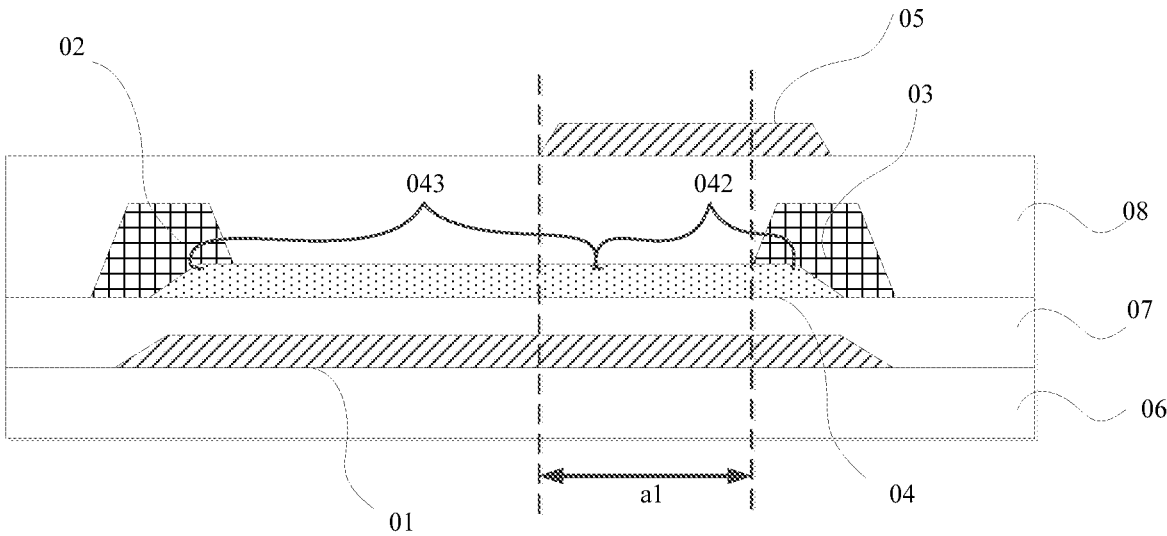

For example, as shown in FIG. 2, the TFT includes a gate electrode 01, a gate insulation layer 07, an active layer 04, a source electrode 02, a drain electrode 03 and an interlayer insulation layer 08 arranged on a base substrate 06. The active layer 04 includes a first portion 042 in contact with the drain electrode 03 and a second portion 043 in contact with the source electrode 02, and an orthogonal projection of the active layer 04 onto the base substrate 06 is located within an orthogonal projection of the gate electrode 01 onto the base substrate 06.

In the embodiment of the present disclosure, the entire channel is controlled through the gate electrode 01. In order to increase the resistance between the gate electrode and the drain electrode, as shown in FIG. 2, the TFT further includes an additional gate electrode 05 arranged at a side of the active layer 04 away from the base substrate, and an orthogonal projection of the additional gate electrode 05 onto the base substrate overlaps with the orthogonal projection of the first portion 042 onto the base substrate, i.e., the orthogonal projection of the additional gate electrode onto the base substrate partially overlaps with the orthogonal projection of the first portion 042 onto the base substrate, or the orthogonal projection of the additional gate electrode onto the base substrate falls within the orthogonal projection of the first portion 042 onto the base substrate, or the orthogonal projection of the first portion 042 onto the base substrate falls within the orthogonal projection of the additional gate electrode onto the base substrate.

As shown in FIG. 2, the orthogonal projection of the additional gate electrode 05 onto the base substrate falls within the orthogonal projection of the gate electrode 01 onto the base substrate. Of course, a part of the orthogonal projection of the additional gate electrode 05 onto the base substrate is also located beyond the orthogonal projection of the gate electrode 01 onto the base substrate.

In this way, the first portion 042 is controlled through applying an electric signal onto the additional gate electrode 05, i.e., a resistance of the first portion 042 is adjusted, so as to adjust the on-state current of the TFT. To be specific, when a positive electric signal is applied to the additional gate electrode 05, a resistance of the first portion 042 is reduced, so it is able to increase the on-state current of the TFT. When a negative electric signal is applied to the additional gate electrode 05, the resistance of the first portion 042 is increased, so it is able to reduce the on-state current of the TFT. Specifically, during the operation of the TFT, a voltage applied to the additional gate electrode 05 is $V\frac{1}{2}$-V1, where V1 is the voltage applied to the gate electrode.

As shown in FIG. 2, a minimum distance between a first boundary of the additional gate electrode 05 close to the source electrode 02 and a second boundary of the drain electrode 03 close to the source electrode 02 is a1 in a direction parallel to the base substrate, a1 is greater than 0 and smaller than L, and L is a length of a channel of the TFT. The channel is a portion of the active layer corresponding to a gap between the source electrode and the drain electrode, and an orthogonal projection of the channel onto the base substrate overlaps with an orthogonal projection of the gap between the source electrode and the drain electrode onto the base substrate. When a1 is greater than 0 and smaller than L, the additional gate electrode mainly controls a region of the channel close to the drain electrode, rather than an entire region of the channel.

Figure 3:
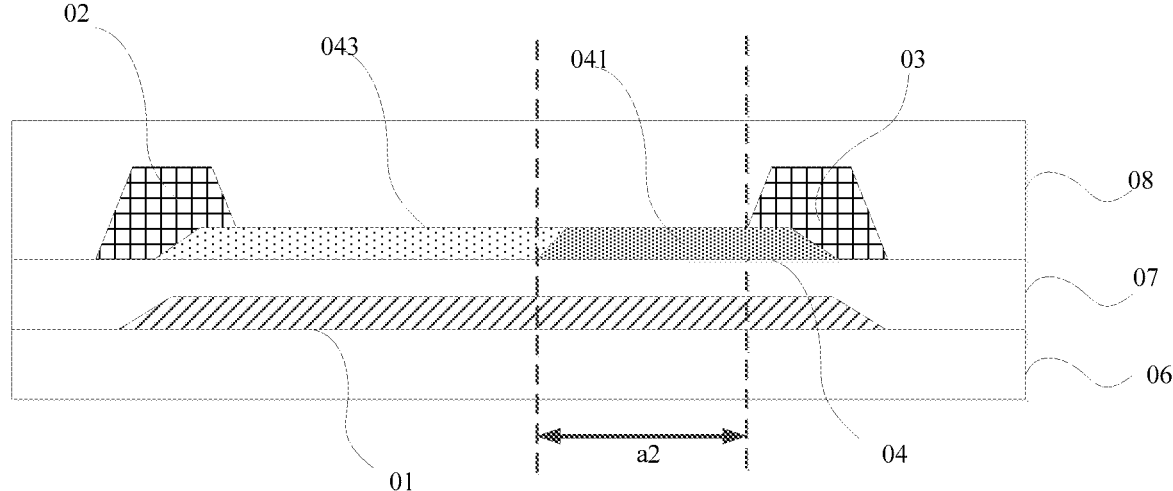

For example, as shown in FIG. 3, the TFT includes a gate electrode 01, a gate insulation layer 07, an active layer 04, a source electrode 02, a drain electrode 03 and an interlayer insulation layer 08 arranged on a base substrate 06. The active layer 04 includes a first portion 041 in contact with the drain electrode 03 and a second portion 043 in contact with the source electrode 02. The first portion 041 is treated to provide a high resistance, e.g., the first portion 041 is subjected to plasma treatment so that resistivity of the first portion 041 is greater than that of the second portion 043. In this way, it is able to increase the resistance of the first portion 041 and reduce the current density in proximity to the drain electrode 03 during the operation of the TFT, thereby to increase the withstand voltage range of the TFT.

To be specific, the resistivity Rs of the first portion 041 meets 100 M$\Omega$/$\square$≥Rs≥1 M$\Omega$/$\square$.

As shown in FIG. 3, a minimum distance between a third boundary of the first portion 041 close to the source electrode 02 and a second boundary of the drain electrode 03 close to the source electrode 02 is a2 in a direction parallel to the base substrate, where a2 is greater than 0 μm and smaller than or equal to 2 μm. In this way, it is merely able to provide a region of the channel close to the drain electrode, rather than the entire channel, with a large resistance.

Figure 4:
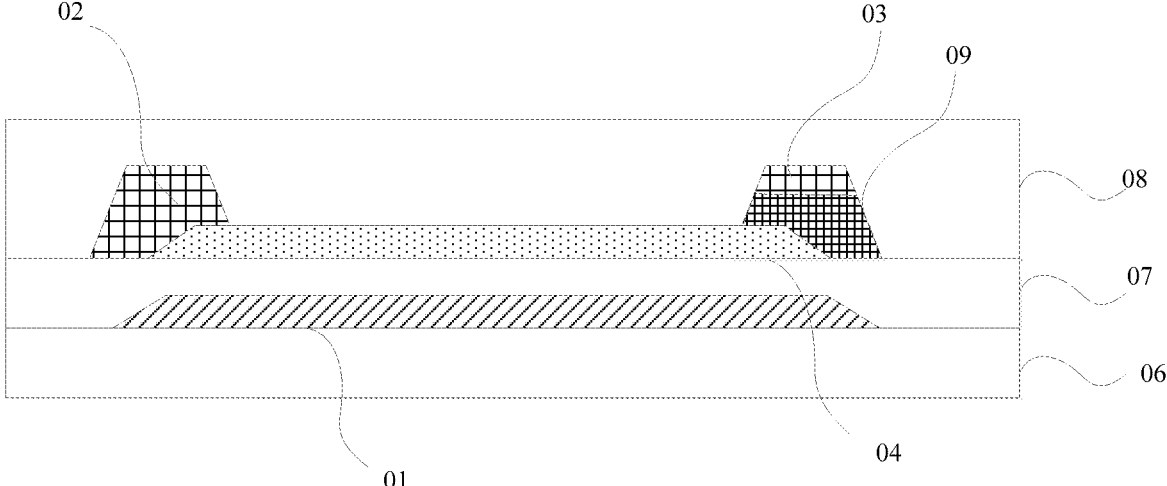

For example, as shown in FIG. 4, the TFT includes a gate electrode 01, a gate insulation layer 07, an active layer 04, a source electrode 02, a drain electrode 03 and an interlayer insulation layer 08 arranged on a base substrate 06. A conductive pattern 09 is arranged between the active layer 04 and the drain electrode 03, and resistivity of the conductive pattern 09 is greater than that of the drain electrode, and the active layer 04 is electrically coupled to the drain electrode 03 through the conductive pattern 09. Through the conductive pattern 09 with a high resistance, it is able to increase the resistance between the gate electrode 01 and the drain electrode 03, and reduce the current density in proximity to the drain electrode 03, thereby to increase the withstand voltage range of the TFT.

In some embodiments of the present disclosure, the resistivity R of the conductive pattern 09 meets 100 MΩ/≥R≥1 MΩ/□. To be specific, the conductive pattern 09 is made of molybdenum oxide.

Figure 5:
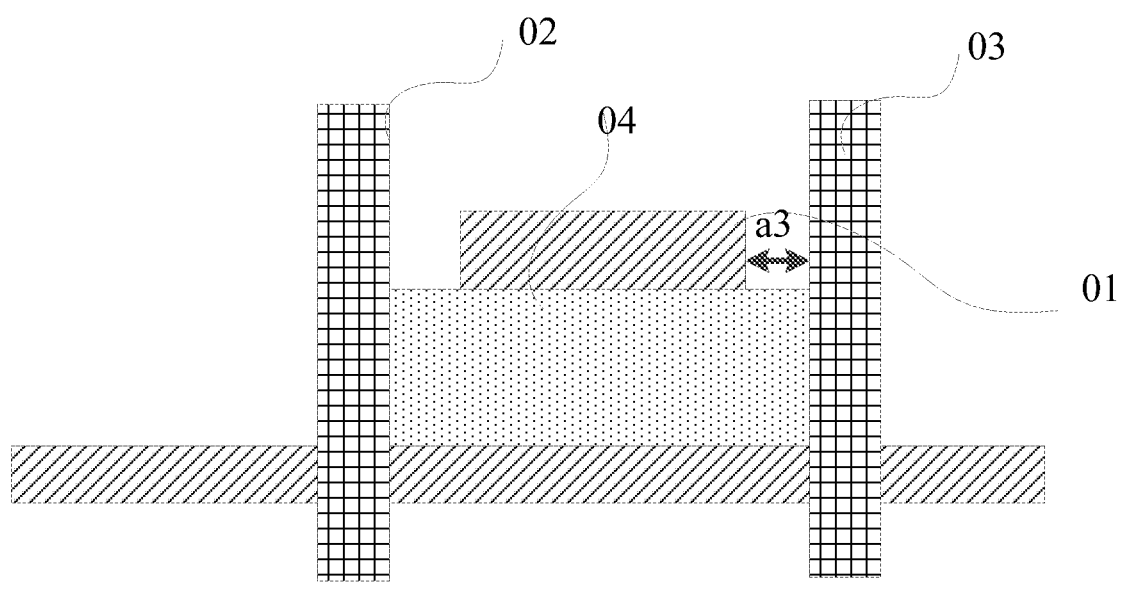
Figure 7:
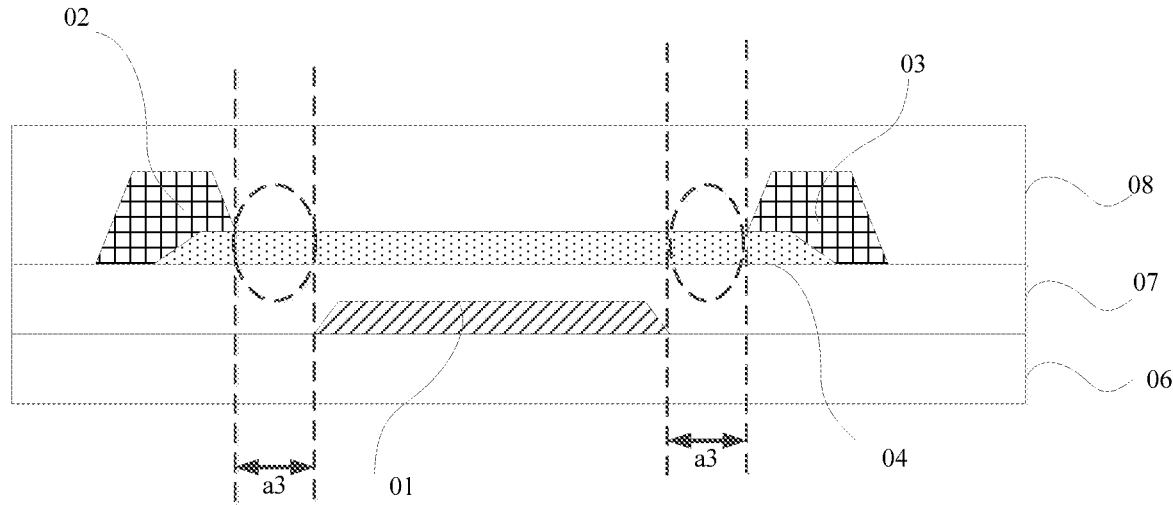

For example, as shown in FIG. 7, the TFT includes a gate electrode 01, a gate insulation layer 07, an active layer 04, a source electrode 02, a drain electrode 03 and an interlayer insulation layer 08 arranged on a base substrate 06. An orthogonal projection of the gate electrode 01 onto the base substrate does not overlap with an orthogonal projection of the source electrode 02 onto the base substrate, and the orthogonal projection of the gate electrode 01 onto the base substrate does not overlap with an orthogonal projection of the drain electrode 03 onto the base substrate. A distance between a fourth boundary of a first orthogonal projection of the gate electrode 01 onto the base substrate close to the source electrode 02 and a fifth boundary of a second orthogonal projection of the source electrode 02 onto the base substrate close to the gate electrode 01 is a3, and a distance between a sixth boundary of the first orthogonal projection of the gate electrode 01 onto the base substrate close to the drain electrode 03 and a seventh boundary of a third orthogonal projection of the drain electrode 03 onto the base substrate close to the gate electrode 01 is a3, where a3 is greater than 0. FIG. 5 is a planar view of the TFT in FIG. 7, and FIG. 7 is a sectional view of the TFT in FIG. 5 along a direction indicated by a3.

In the embodiment of the present disclosure, the gate electrode electric field is relatively weak at a position indicated by an elliptical dotted box, and it is impossible to efficiently control a portion of the channel at this position (i.e., the portion of the channel in the elliptically dotted box), so it is able to increase a resistance of the portion of the channel, and reduce the current density in proximity to the drain electrode 03, thereby to increase the withstand voltage range of the TFT. When the gate electrode is energized, the portion of the channel is almost not affected by the gate electrode electric field, and its conductivity is poor. In order to ensure the on-state current of the TFT, a3 is smaller than 2 μm.

In addition, when the orthogonal projection of the gate electrode 01 onto the base substrate does not overlap with the orthogonal projection of the source electrode 02 onto the base substrate and the orthogonal projection of the gate electrode 01 onto the base substrate does not overlap with the orthogonal projection of the drain electrode 03 onto the base substrate, there is no parasitic capacitor between the gate electrode 01 and each of the source electrode 02 and the drain electrode 03, so it is able to reduce the power consumption of the TFT.

Figure 8:
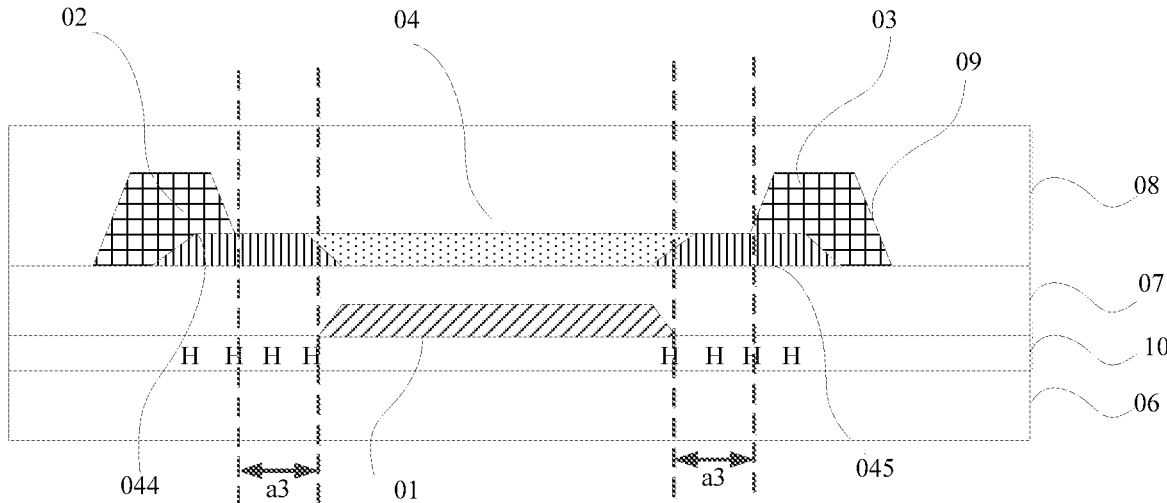

In order to ensure the on-state current of the TFT, as shown in FIG. 8, the TFT further includes a buffer layer 10 arranged between the gate electrode and the base substrate. The buffer layer is made of SiNx, and it contains a large amount of hydrogen that is capable of being diffused into the active layer, so as to enable the active layer to become a conductor, thereby to increase the on-state current of the TFT. The active layer includes a third portion 044 and a fourth portion 045, an orthogonal projection of the third portion 044 onto the base substrate is located between, and does not overlap with, the first orthogonal projection and the second orthogonal projection, an orthogonal projection of the fourth portion 045 onto the base substrate is located between, and does not overlap with, the first orthogonal projection and the third orthogonal projection, and the third portion 044 and the fourth portion 045 are each a lightly-doped region, so as to improve the conductivity and ensure the on-state current of the TFT.

Due to the existence of the gate electrode, a region of the active layer corresponding to the gate electrode is less affected by hydrogen, so it is able to achieve a switching function of a semiconductor. In addition, due to an increase in the withstand voltage range of the TFT, a thickness of the gate insulation layer may be decreased appropriately, e.g., smaller than 300 nm.

Figure 6:
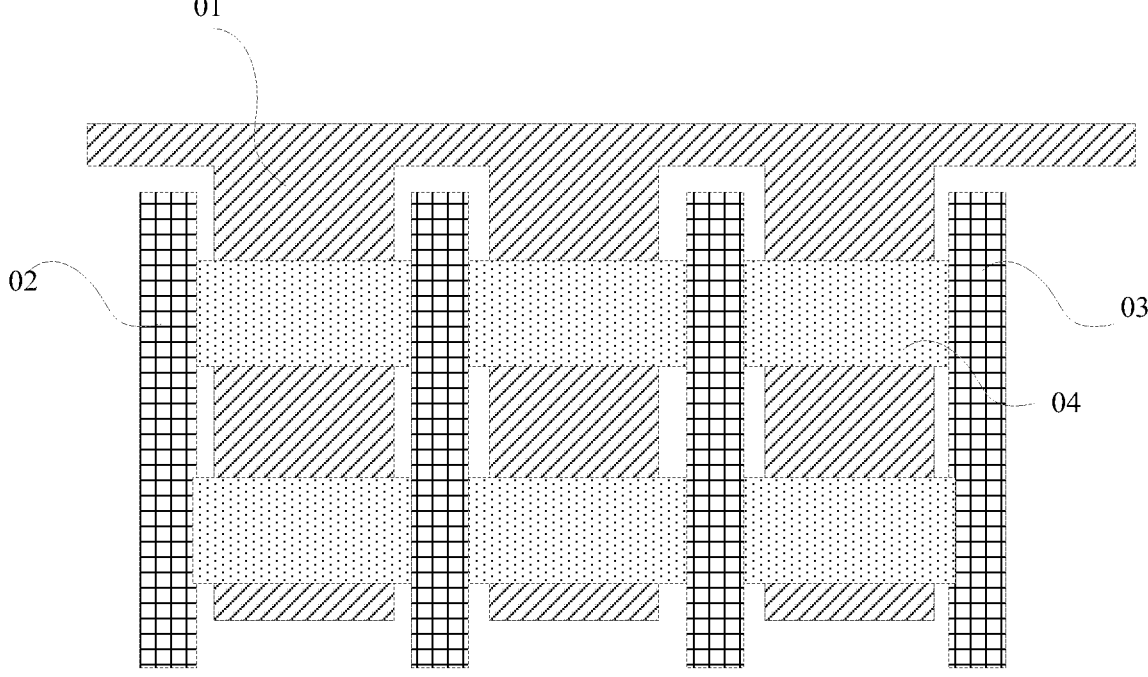

In the case of a plurality of TFTs, the TFTs are arranged in a mode as shown in FIG. 6, so as to ensure that the gate electrode does not overlap with each of the source electrode and the drain electrode.

Figure 9:
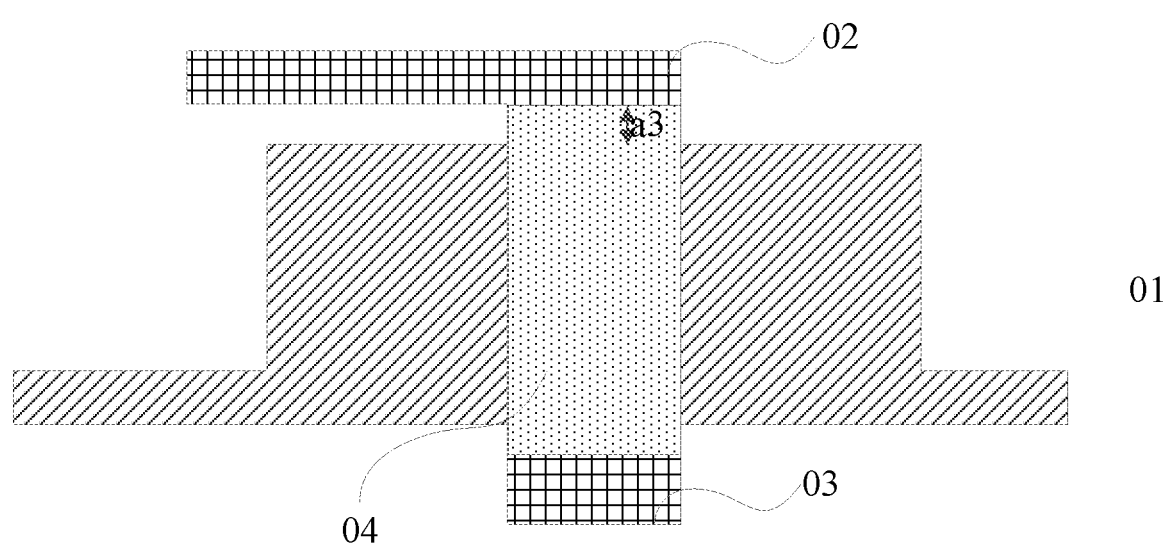
Figure 10:
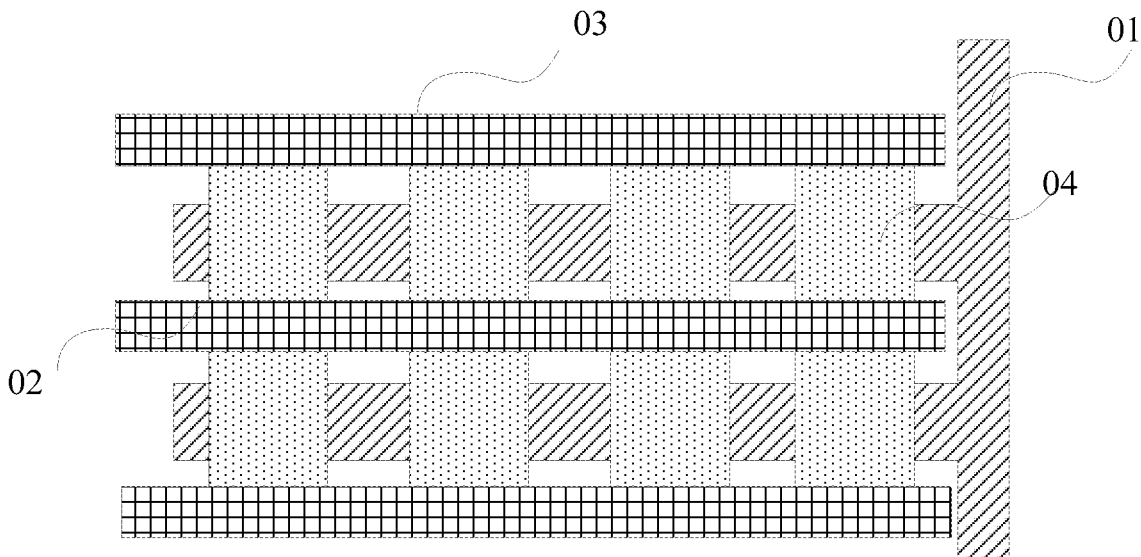

FIGS. 5 and 6 show an H-like TFT. As shown in FIG. 9, the TFT is of a V-like shape, and FIG. 7 shows a cross section of the TFT in FIG. 9 along a direction indicated by a3. In the direction indicated by a3, a size of the gate electrode is smaller than a size of the active layer, so that the gate electrode does not overlap with each of the source electrode and the drain electrode. In the case of a plurality of TFTs, the TFTs are arranged in a mode as shown in FIG. 10, so as to ensure that the gate electrode does not overlap with each of the source electrode and the drain electrode.

Figure 11:
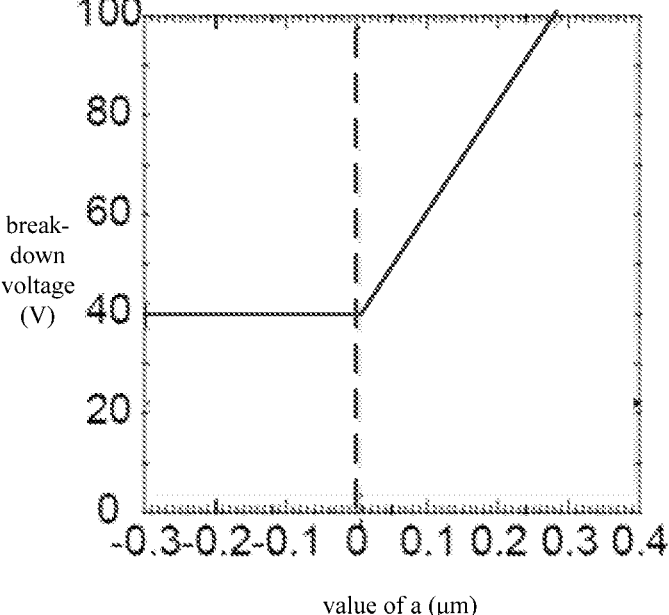
FIG. 11 is a schematic view showing a relationship between a value of a and a breakdown voltage of the TFT according to one embodiment of the present disclosure.

FIG. 11 shows a relationship between a value of a and a breakdown voltage of the TFT, where a includes a1, a2 and a3. When the value of a is smaller than or equal to 0, the breakdown voltage of the TFT is relatively small, about 20V. When the value of a is greater than 0, the larger the value of a, the larger the breakdown voltage of the TFT, i.e., it is able to increase the withstand voltage range of the TFT.

The present disclosure further provides in some embodiments a display substrate which includes the above-mentioned TFT.

In some embodiments of the present disclosure, the display substrate includes the TFT in FIG. 1, and a voltage applied to the additional gate electrode is 5V to 10V during the display.

In some embodiments of the present disclosure, the display substrate includes the TFT in FIG. 2, and a voltage applied to the gate electrode is V1 and a voltage applied to the additional gate electrode is V½-V1 during the display.

The present disclosure further provides in some embodiments a display device, which includes the above-mentioned display substrate. The display device may include, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The display device may be any product or member having a display function, e.g., liquid crystal television, liquid crystal display, digital photo frame, mobile phone or tablet computer. The display device further includes a flexible circuit board, a printed circuit board and a back plate.

To be specific, the display device is a high-mobility display product driven at a high voltage, e.g., a display product with a resolution more than 4K, a television with a resolution more than 8K, or a Virtual Reality (VR) product.

The present disclosure further provides in some embodiments a method for manufacturing a TFT, which includes: providing a base substrate; forming a gate electrode on the base substrate; forming an active layer at a side of the gate electrode away from the base substrate, an orthogonal projection of the active layer onto the base substrate overlapping with an orthogonal projection of the gate electrode onto the base substrate; and forming a source electrode and a drain electrode at a side of the active layer away from the base substrate, the source electrode and the drain electrode being coupled to the active layer. A resistance between the gate electrode and the drain electrode is greater than a resistance between the gate electrode and the source electrode.

In the embodiments of the present disclosure, the resistance between the gate electrode and the drain electrode of the TFT is greater than the resistance between the gate electrode and the source electrode, and a withstand voltage range of the TFT is in direct proportion to the resistance between the gate electrode and the drain electrode. Through providing a large resistance between the gate electrode and the drain electrode, it is able to reduce a current density at a position in proximity to the drain electrode, thereby to increase the withstand voltage range of the TFT.

In some embodiments of the present disclosure, the orthogonal projection of the gate electrode onto the base substrate does not overlap with an orthogonal projection of the drain electrode onto the base substrate, and the orthogonal projection of the gate electrode onto the base substrate overlaps with an orthogonal projection of the source electrode onto the base substrate. A portion of the active layer between the gate electrode and the drain electrode is spaced apart from the gate electrode at a large distance. At this position, a gate electrode electric field is weak, and it is difficult for the gate electrode to efficiently control the portion of the active layer. As a result, it is able to improve a distance of a channel between the gate electrode and the drain electrode, and reduce the current density in proximity to the drain electrode, thereby to increase the withstand voltage range of the TFT.

For example, as shown in FIG. 1, the method includes forming a gate electrode 01, a gate insulation layer 07, an active layer 04, a source electrode 02, a drain electrode 03, and an interlayer insulation layer 08 sequentially on a base substrate 06. The active layer 04 includes a first portion 042 in contact with the drain electrode 03 and a second portion 043 in contact with the source electrode 02. An orthogonal projection of the first portion 042 onto the base substrate does not overlap with an orthogonal projection of the gate electrode 01 onto the base substrate, and an orthogonal projection of the second portion 043 onto the base substrate completely or partially overlaps with the orthogonal projection of the gate electrode 01 onto the base substrate. At this time, the gate electrode 01 is spaced apart from the first portion 042 at a large distance, and it is difficult for the gate electrode 01 to efficiently control the first portion 042. As a result, it is able to increase a resistance of the first portion 042 during the operation of the TFT, and reduce a current density in proximity to the drain electrode 03, thereby to increase the withstand voltage range of the TFT.

An on-state current of the TFT is reduced when it is difficult for the gate electrode 02 to efficiently control the first portion 042. In order to ensure the on-state current of the TFT, as shown in FIG. 1, the TFT further includes an additional gate electrode 05. An orthogonal projection of the additional gate electrode 05 onto the base substrate overlaps with the orthogonal projection of the first portion 042 onto the base substrate, i.e., the orthogonal projection of the additional gate electrode onto the base substrate partially overlaps with the orthogonal projection of the first portion 042 onto the base substrate, or the orthogonal projection of the additional gate electrode onto the base substrate falls within the orthogonal projection of the first portion 042 onto the base substrate, or the orthogonal projection of the first portion 042 onto the base substrate falls within the orthogonal projection of the additional gate electrode onto the base substrate.

In this way, the first portion 042 is controlled through applying an electric signal onto the additional gate electrode 05, so as to adjust the on-state current of the TFT. To be specific, when a positive electric signal is applied to the additional gate electrode 05, a resistance of the first portion 042 is reduced, so it is able to increase the on-state current of the TFT. When a negative electric signal is applied to the additional gate electrode 05, the resistance of the first portion 042 is increased, so it is able to reduce the on-state current of the TFT. Specifically, during the operation of the TFT, a voltage applied to the additional gate electrode 05 is 5V to 10V, so as to ensure the on-state current of the TFT.

The additional gate electrode 05 and the gate electrode 01 are arranged at a same side of the active layer 04 or at different sides of the active layer 04, and they are insulated from each other.

As shown in FIG. 1, a minimum distance between a first boundary of the additional gate electrode 05 close to the source electrode 02 and a second boundary of the drain electrode 03 close to the source electrode 02 is a1 in a direction parallel to the base substrate, a1 is greater than 0 and smaller than L, and L is a length of a channel of the TFT. The channel is a portion of the active layer corresponding to a gap between the source electrode and the drain electrode, and an orthogonal projection of the channel onto the base substrate overlaps with an orthogonal projection of the gap between the source electrode and the drain electrode onto the base substrate. When a1 is greater than 0 and smaller than L, the additional gate electrode mainly controls a region of the channel close to the drain electrode, rather than an entire region of the channel.

For example, as shown in FIG. 2, the method includes forming a gate electrode 01, a gate insulation layer 07, an active layer 04, a source electrode 02, a drain electrode 03 and an interlayer insulation layer 08 sequentially on a base substrate 06. The active layer 04 includes a first portion 042 in contact with the drain electrode 03 and a second portion 043 in contact with the source electrode 02, and an orthogonal projection of the active layer 04 onto the base substrate 06 is located within an orthogonal projection of the gate electrode 01 onto the base substrate 06.

In the embodiment of the present disclosure, the entire channel is controlled through the gate electrode 01. In order to increase the resistance between the gate electrode and the drain electrode, as shown in FIG. 2, the TFT further includes an additional gate electrode 05 arranged at a side of the active layer 04 away from the base substrate, and an orthogonal projection of the additional gate electrode 05 onto the base substrate overlaps with the orthogonal projection of the first portion 042 onto the base substrate, i.e., the orthogonal projection of the additional gate electrode onto the base substrate partially overlaps with the orthogonal projection of the first portion 042 onto the base substrate, or the orthogonal projection of the additional gate electrode onto the base substrate falls within the orthogonal projection of the first portion 042 onto the base substrate, or the orthogonal projection of the first portion 042 onto the base substrate falls within the orthogonal projection of the additional gate electrode onto the base substrate.

As shown in FIG. 2, the orthogonal projection of the additional gate electrode 05 onto the base substrate falls within the orthogonal projection of the gate electrode 01 onto the base substrate. Of course, a part of the orthogonal projection of the additional gate electrode 05 onto the base substrate is also located beyond the orthogonal projection of the gate electrode 01 onto the base substrate.

In this way, the first portion 042 is controlled through applying an electric signal onto the additional gate electrode 05, i.e., a resistance of the first portion 042 is adjusted, so as to adjust the on-state current of the TFT. To be specific, when a positive electric signal is applied to the additional gate electrode 05, a resistance of the first portion 042 is reduced, so it is able to increase the on-state current of the TFT. When a negative electric signal is applied to the additional gate electrode 05, the resistance of the first portion 042 is increased, so it is able to reduce the on-state current of the TFT. Specifically, during the operation of the TFT, a voltage applied to the additional gate electrode 05 is V½-V1, where V1 is the voltage applied to the gate electrode.

As shown in FIG. 2, a minimum distance between a first boundary of the additional gate electrode 05 close to the source electrode 02 and a second boundary of the drain electrode 03 close to the source electrode 02 is a1 in a direction parallel to the base substrate, a1 is greater than 0 and smaller than L, and L is a length of a channel of the TFT. The channel is a portion of the active layer corresponding to a gap between the source electrode and the drain electrode, and an orthogonal projection of the channel onto the base substrate overlaps with an orthogonal projection of the gap between the source electrode and the drain electrode onto the base substrate. When a1 is greater than 0 and smaller than L, the additional gate electrode mainly controls a region of the channel close to the drain electrode, rather than an entire region of the channel.

For example, as shown in FIG. 3, the method includes forming a gate electrode 01, a gate insulation layer 07, an active layer 04, a source electrode 02, a drain electrode 03 and an interlayer insulation layer 08 sequentially on a base substrate 06. The active layer 04 includes a first portion 041 in contact with the drain electrode 03 and a second portion 043 in contact with the source electrode 02. The first portion 041 is treated to provide a high resistance, e.g., the first portion 041 is subjected to plasma treatment so that resistivity of the first portion 041 is greater than that of the second portion 043. In this way, it is able to increase the resistance of the first portion 041 and reduce the current density in proximity to the drain electrode 03 during the operation of the TFT, thereby to increase the withstand voltage range of the TFT.

To be specific, the resistivity Rs of the first portion 041 meets 100 MΩ/□≥Rs≥Ω/□.

As shown in FIG. 3, a minimum distance between a third boundary of the first portion 041 close to the source electrode 02 and a second boundary of the drain electrode 03 close to the source electrode 02 is a2 in a direction parallel to the base substrate, where a2 is greater than 0 μm and smaller than or equal to 2 μm. In this way, it is merely able to provide a region of the channel close to the drain electrode, rather than the entire channel, with a large resistance.

For example, as shown in FIG. 4, the method includes forming a gate electrode 01, a gate insulation layer 07, an active layer 04, a source electrode 02, a drain electrode 03 and an interlayer insulation layer 08 sequentially on a base substrate 06. A conductive pattern 09 is arranged between the active layer 04 and the drain electrode 03, and resistivity of the conductive pattern 09 is greater than that of the drain electrode, and the active layer 04 is electrically coupled to the drain electrode 03 through the conductive pattern 09. Through the conductive pattern 09 with a high resistance, it is able to increase the resistance between the gate electrode 01 and the drain electrode 03, and reduce the current density in proximity to the drain electrode 03, thereby to increase the withstand voltage range of the TFT.

In some embodiments of the present disclosure, the resistivity R of the conductive pattern 09 meets 100 MΩ/□≥R≥1 MΩ/□. To be specific, the conductive pattern 09 is made of molybdenum oxide.

For example, as shown in FIG. 7, the method includes forming a gate electrode 01, a gate insulation layer 07, an active layer 04, a source electrode 02, a drain electrode 03 and an interlayer insulation layer 08 sequentially on a base substrate 06. An orthogonal projection of the gate electrode 01 onto the base substrate does not overlap with an orthogonal projection of the source electrode 02 onto the base substrate, and the orthogonal projection of the gate electrode 01 onto the base substrate does not overlap with an orthogonal projection of the drain electrode 03 onto the base substrate. A distance between a fourth boundary of a first orthogonal projection of the gate electrode 01 onto the base substrate close to the source electrode 02 and a fifth boundary of a second orthogonal projection of the source electrode 02 onto the base substrate close to the gate electrode 01 is a3, and a distance between a sixth boundary of the first orthogonal projection of the gate electrode 01 onto the base substrate close to the drain electrode 03 and a seventh boundary of a third orthogonal projection of the drain electrode 03 onto the base substrate close to the gate electrode 01 is a3, where a3 is greater than 0. FIG. 5 is a planar view of the TFT in FIG. 7, and FIG. 7 is a sectional view of the TFT in FIG. 5 along a direction indicated by a3.

In the embodiment of the present disclosure, the gate electrode electric field is relatively weak at a position indicated by an elliptical dotted box, and it is impossible to efficiently control a portion of the channel at this position (i.e., the portion of the channel in the elliptically dotted box), so it is able to increase a resistance of the portion of the channel, and reduce the current density in proximity to the drain electrode 03, thereby to increase the withstand voltage range of the TFT. When the gate electrode is energized, the portion of the channel is almost not affected by the gate electrode electric field, and its conductivity is poor. In order to ensure the on-state current of the TFT, a3 is smaller than 2 μm.

In addition, when the orthogonal projection of the gate electrode 01 onto the base substrate does not overlap with the orthogonal projection of the source electrode 02 onto the base substrate and the orthogonal projection of the gate electrode 01 onto the base substrate does not overlap with the orthogonal projection of the drain electrode 03 onto the base substrate, there is no parasitic capacitor between the gate electrode 01 and each of the source electrode 02 and the drain electrode 03, so it is able to reduce the power consumption of the TFT.

In order to ensure the on-state current of the TFT, as shown in FIG. 8, the method further includes forming a buffer layer 10 between the gate electrode and the base substrate. The buffer layer is made of SiNx, and it contains a large amount of hydrogen that is capable of being diffused into the active layer, so as to enable the active layer to become a conductor, thereby to increase the on-state current of the TFT. The active layer includes a third portion 044 and a fourth portion 045, an orthogonal projection of the third portion 044 onto the base substrate is located between, and does not overlap with, the first orthogonal projection and the second orthogonal projection, an orthogonal projection of the fourth portion 045 onto the base substrate is located between, and does not overlap with, the first orthogonal projection and the third orthogonal projection, and the third portion 044 and the fourth portion 045 are each a lightly-doped region, so as to improve the conductivity and ensure the on-state current of the TFT.

Through controlling a film-forming process of the buffer layer, it is able to control the content of hydrogen in the buffer layer. To be specific, a ratio of $NH_3$ to $SiH_4$ in the buffer layer is controlled to be greater than 5 in the film-forming process.

Due to the existence of the gate electrode, a region of the active layer corresponding to the gate electrode is less affected by hydrogen, so it is able to achieve a switching function of a semiconductor. In addition, due to an increase in the withstand voltage range of the TFT, a thickness of the gate insulation layer may be decreased appropriately, e.g., smaller than 300 nm.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A Thin Film Transistor (TFT), comprising: a base substrate; a gate electrode arranged on the base substrate; an active layer arranged at a side of the gate electrode away from the base substrate, an orthogonal projection of the active layer onto the base substrate overlapping with an orthogonal projection of the gate electrode onto the base substrate; and a source electrode and a drain electrode arranged at a side of the active layer away from the base substrate and coupled to the active layer, wherein a resistance between the gate electrode and the drain electrode is greater than a resistance between the gate electrode and the source electrode, wherein the orthogonal projection of the gate electrode onto the base substrate does not overlap with an orthogonal projection of the drain electrode onto the base substrate, and the orthogonal projection of the gate electrode onto the base substrate overlaps with an orthogonal projection of the source electrode onto the base substrate;

where in the TFT further comprises an additional gate electrode; and wherein a minimum distance between a first boundary of the additional gate electrode close to the source electrode and a second boundary of the drain electrode close to the source electrode is a1 in a direction parallel to the base substrate, a1 is greater than 0 and smaller than L, and L is a length of a channel of the TFT.

2. The TFT according to claim 1, wherein the active layer comprises a first portion in contact with the drain electrode and a second portion in contact with the source electrode, an orthogonal projection of the first portion onto the base substrate does not overlap with the orthogonal projection of the gate electrode onto the base substrate, and an orthogonal projection of the second portion onto the base substrate overlaps with the orthogonal projection of the gate electrode onto the base substrate, and an orthogonal projection of the additional gate electrode onto the base substrate overlaps with the orthogonal projection of the first portion onto the base substrate.

3. The TFT according to claim 1, wherein the orthogonal projection of the active layer onto the base substrate falls within the orthogonal projection of the gate electrode onto the base substrate, and the active layer comprises a first portion in contact with the drain electrode and a second portion in contact with the source electrode, wherein the TFT further comprises an additional gate electrode arranged at a side of the active layer away from the base substrate, and an orthogonal projection of the additional gate electrode onto the base substrate overlaps with an orthogonal projection of the first portion onto the base substrate.

4. The TFT according to claim 3, wherein the orthogonal projection of the additional gate electrode onto the base substrate falls within the orthogonal projection of the gate electrode onto the base substrate.

5. The TFT according to claim 1, wherein the active layer comprises a first portion in contact with the drain electrode and a second portion in contact with the source electrode, and resistivity of the first portion is greater than resistivity of the second portion.

6. The TFT according to claim 5, wherein the resistivity $R_S$ of the first portion meets 100 MΩ/□≥Rs≥1 MΩ/□.

7. The TFT according to claim 5, wherein a minimum distance between a third boundary of the first portion close to the source electrode and a second boundary of the drain electrode close to the source electrode is a2 in a direction parallel to the base substrate, where a2 is greater than 0um and smaller than or equal to 2 μm.

8. The TFT according to claim 1, further comprising a conductive pattern arranged between the active layer and the drain electrode, wherein resistivity of the conductive pattern is greater than resistivity of the drain electrode, and the active layer is electrically coupled to the drain electrode through the conductive pattern.

9. The TFT according to claim 8, wherein the resistivity R of the conductive pattern meets 100 MΩ/□≥R≥1 MΩ/□.

10. The TFT according to claim 1, wherein the orthogonal projection of the gate electrode onto the base substrate does not overlap with an orthogonal projection of the source electrode onto the base substrate, and the orthogonal projection of the gate electrode onto the base substrate does not overlap with an orthogonal projection of the drain electrode onto the base substrate, wherein a distance between a fourth boundary of a first orthogonal projection of the gate electrode onto the base substrate close to the source electrode and a fifth boundary of a second orthogonal projection of the source electrode onto the base substrate close to the gate electrode is a3, and a distance between a sixth boundary of the first orthogonal projection of the gate electrode onto the base substrate close to the drain electrode and a seventh boundary of a third orthogonal projection of the drain electrode onto the base substrate close to the gate electrode is a3, where a3 is greater than 0.

11. The TFT according to claim 10, wherein a3 is smaller than 2 μm.

12. The TFT according to claim 10, further comprising a buffer layer arranged between the gate electrode and the base substrate, wherein the active layer comprises a third portion and a fourth portion, an orthogonal projection of the third portion onto the base substrate is located between, and does not overlap with, the first orthogonal projection and the second orthogonal projection, an orthogonal projection of the fourth portion onto the base substrate is located between, and does not overlap with, the first orthogonal projection and the third orthogonal projection, and the third portion and the fourth portion are each a lightly-doped region.

13. A display substrate, comprising a Thin Film Transistor (TFT), wherein the TFT comprises: a base substrate; a gate electrode arranged on the base substrate; an active layer arranged at a side of the gate electrode away from the base substrate, an orthogonal projection of the active layer onto the base substrate overlapping with an orthogonal projection of the gate electrode onto the base substrate; and a source electrode and a drain electrode arranged at a side of the active layer away from the base substrate and coupled to the active layer, wherein a resistance between the gate electrode and the drain electrode is greater than a resistance between the gate electrode and the source electrode, wherein the orthogonal projection of the gate electrode onto the base substrate does not overlap with an orthogonal projection of the drain electrode onto the base substrate, and the orthogonal projection of the gate electrode onto the base substrate overlaps with an orthogonal projection of the source electrode onto the base substrate;

where in the TFT further comprises an additional gate electrode; and wherein a minimum distance between a first boundary of the additional gate electrode close to the source electrode and a second boundary of the drain electrode close to the source electrode is a1 in a direction parallel to the base substrate, a1 is greater than 0 and smaller than L, and L is a length of a channel of the TFT.

14. The display substrate according to claim 13, wherein the active layer comprises a first portion in contact with the drain electrode and a second portion in contact with the source electrode, an orthogonal projection of the first portion onto the base substrate does not overlap with the orthogonal projection of the gate electrode onto the base substrate, and an orthogonal projection of the second portion onto the base substrate overlaps with the orthogonal projection of the gate electrode onto the base substrate, and an orthogonal projection of the additional gate electrode onto the base substrate overlaps with the orthogonal projection of the first portion onto the base substrate, wherein a voltage applied to the additional gate electrode is 5V to 10V during display.

15. The display substrate according to claim 13, wherein the orthogonal projection of the active layer onto the base substrate falls within the orthogonal projection of the gate electrode onto the base substrate, and the active layer comprises a first portion in contact with the drain electrode and a second portion in contact with the source electrode, wherein the TFT further comprises an additional gate electrode arranged at a side of the active layer away from the base substrate, and an orthogonal projection of the additional gate electrode onto the base substrate overlaps with an orthogonal projection of the first portion onto the base substrate, wherein the orthogonal projection of the additional gate electrode onto the base substrate falls within the orthogonal projection of the gate electrode onto the base substrate, wherein a voltage applied to the gate electrode is V1 and a voltage applied to the additional gate electrode is V½–V1 during display.

16. A method for manufacturing a TFT, comprising: providing a base substrate; forming a gate electrode on the base substrate; forming an active layer at a side of the gate electrode away from the base substrate, an orthogonal projection of the active layer onto the base substrate overlapping with an orthogonal projection of the gate electrode onto the base substrate; and forming a source electrode and a drain electrode at a side of the active layer away from the base substrate, the source electrode and the drain electrode being coupled to the active layer, wherein a resistance between the gate electrode and the drain electrode is greater than a resistance between the gate electrode and the source electrode, wherein the orthogonal projection of the gate electrode onto the base substrate does not overlap with an orthogonal projection of the drain electrode onto the base substrate, and the orthogonal projection of the gate electrode onto the base substrate overlaps with an orthogonal projection of the source electrode onto the base substrate;

where in the TFT further comprises an additional gate electrode; and where in a minimum distance between a first boundary of the additional gate electrode close to the source electrode and a second boundary of the drain electrode close to the source electrode is a1 in a direction parallel to the base substrate, a1 is greater than 0 and smaller than L, and L is a length of a channel of the TFT.

* * * * *